(12) United States Patent
Dhyllon

(10) Patent No.: US 11,476,094 B2
(45) Date of Patent: Oct. 18, 2022

(54) DEVICE AND SYSTEM FOR ENERGY GENERATION BY CONTROLLED PLASMA IGNITION AND INCINERATION

(71) Applicant: Amen Dhyllon, Wynnewood, PA (US)

(72) Inventor: Amen Dhyllon, Wynnewood, PA (US)

(73) Assignee: Serendipity Technologies LLC, Wynnewood, PA (US)

( * ) Notice: Subject to any disclaimer, the term of this patent is extended or adjusted under 35 U.S.C. 154(b) by 744 days.

(21) Appl. No.: 16/517,617

(22) Filed: Jul. 21, 2019

(65) Prior Publication Data

US 2020/0027703 A1 Jan. 23, 2020

Related U.S. Application Data

(60) Provisional application No. 62/700,923, filed on Jul. 20, 2018.

(51) Int. Cl.
| | |
|---|---|
| *F23G 7/06* | (2006.01) |
| *H01J 37/32* | (2006.01) |
| *B01D 53/34* | (2006.01) |
| *B01D 53/32* | (2006.01) |

(52) U.S. Cl.
CPC ........ *H01J 37/32449* (2013.01); *B01D 53/32* (2013.01); *B01D 53/34* (2013.01); *F23G 7/066* (2013.01)

(58) Field of Classification Search
CPC ........ F23G 7/066; F23G 5/0276; F23G 5/085; F23G 2204/201; C01B 2203/0405; C01B 2203/0475; C01B 2203/84; Y02C 20/40; Y02E 20/12; Y02E 60/36; F23M 2900/13003; B01D 53/22; B01D 2256/16; B01D 2257/504
USPC ....................................................... 110/236
See application file for complete search history.

(56) References Cited

U.S. PATENT DOCUMENTS

| | | | | |
|---|---|---|---|---|
| 8,283,512 | B1* | 10/2012 | Maganas | F23G 5/46 |
| | | | | 422/140 |
| 9,518,733 | B1* | 12/2016 | Dhyllon | F23G 5/085 |
| 9,702,552 | B2* | 7/2017 | Ali | F23G 7/003 |
| 9,713,244 | B2* | 7/2017 | Tabata | H02M 7/48 |
| 10,342,110 | B1* | 7/2019 | Dhyllon | H05H 1/04 |
| 2007/0069118 | A1* | 3/2007 | Economou | H01J 37/3244 |
| | | | | 250/251 |
| 2009/0142929 | A1* | 6/2009 | Chen | H01L 21/32136 |
| | | | | 438/711 |
| 2011/0305961 | A1* | 12/2011 | Gladkov | F23G 7/061 |
| | | | | 429/417 |
| 2013/0252115 | A1* | 9/2013 | Hong | F01K 13/00 |
| | | | | 123/3 |
| 2014/0116490 | A1* | 5/2014 | Morgan | C01B 3/501 |
| | | | | 136/202 |
| 2017/0159930 | A1* | 6/2017 | Lin | F23K 5/002 |
| 2019/0372449 | A1* | 12/2019 | Mills | G21B 3/00 |

* cited by examiner

*Primary Examiner* — Tom P Duong
(74) *Attorney, Agent, or Firm* — Adam Warwick Bell; Matthew Rupert Kaser

(57) ABSTRACT

A device and system for energy generation using plasma incineration and further, for producing electricity by hydrogen gas generation and combustion.

10 Claims, 4 Drawing Sheets

DEVICE AND SYSTEM FOR ENERGY GENERATION BY CONTROLLED PLASMA IGNITION AND INCINERATION

RELATIONSHIP TO OTHER APPLICATIONS

This application claims priority to and the benefit of U.S. provisional application 62/700,923 filed 20 Jul. 2018. Which, together with any disclosures mentioned herein, in incorporated by reference for all purposes.

FILED OF THE INVENTION

The present invention relates to a device and system for energy generation by controlled plasma ignition and incineration. Additionally, the invention relates to the production of hydrogen gas as a byproduct of controlled plasma ignition and incineration. More specifically, the invention encompasses a system that provides and contains a self-sustaining exothermic reaction by use of plasma-mediated incineration. The self-contained incinerator may be used for burning refuse in an industrial, municipal or household environment, for the production of electricity, and for the total destruction of toxic substances including dioxins. Additionally, the invention may be used to efficiently produce large quantities of hydrogen gas.

BACKGROUND OF THE INVENTION

Municipal solid waste predominantly includes food wastes, yard wastes, containers and product packaging, and other miscellaneous inorganic wastes from residential, commercial, institutional, and industrial sources. Examples of organic wastes are newspapers, clothing, food scrap, boxes, disposable tableware, office and classroom paper, furniture, wood pallets, rubber tires, and canteen or cafeteria wastes. Municipal solid waste generally does not include industrial wastes, agricultural wastes, and sewage sludge. Waste collection is performed by the municipality within a given area. Waste is usually in either solid or semisolid form. Since such waste accumulates in the territories managed by municipalities responsible for its removal and storage, it is termed 'municipal solid waste'. Disposal of municipal waste has been a major challenge in the world and is generally accomplished by land-filling or incineration. There is a huge need for elimination of landfill problems for garbage disposal. There is a need for an incineration process that is efficient, produces low carbon dioxide and Sulphur compounds in the flue gasses, and results in elimination of dioxin emissions. Additionally, there is a great need for energy production from waste. The present invention provides complete destruction of waste without producing harmful byproducts, and provides a method of cheap and effective energy generation by the incineration of waste using a plasma ignition system.

OBJECTS AND SUMMARY OF THE INVENTION

It is a general object of the present invention to provide a device and system for energy generation by controlled plasma ignition and incineration of waste. It is another object of the present invention to provide a refuse burning apparatus and method which burns refuse without releasing air polluting contaminants into the ambient environment. The present invention provides true complete combustion not leaving any extra oxygen molecules available to form any toxic substances such as difurans, dioxins, SOX, NOX, and so results in a flue gas containing only trace amounts of these elements compared to any other waste incineration systems. It is a still another object to provide an incinerator with a short, closed cycle process.

BRIEF DESCRIPTION OF THE INVENTION

The invention is a device and system for energy generation using plasma incineration and further, for producing electricity by hydrogen gas generation and combustion.

DETAILED DESCRIPTION OF THE INVENTION

Figure 1:
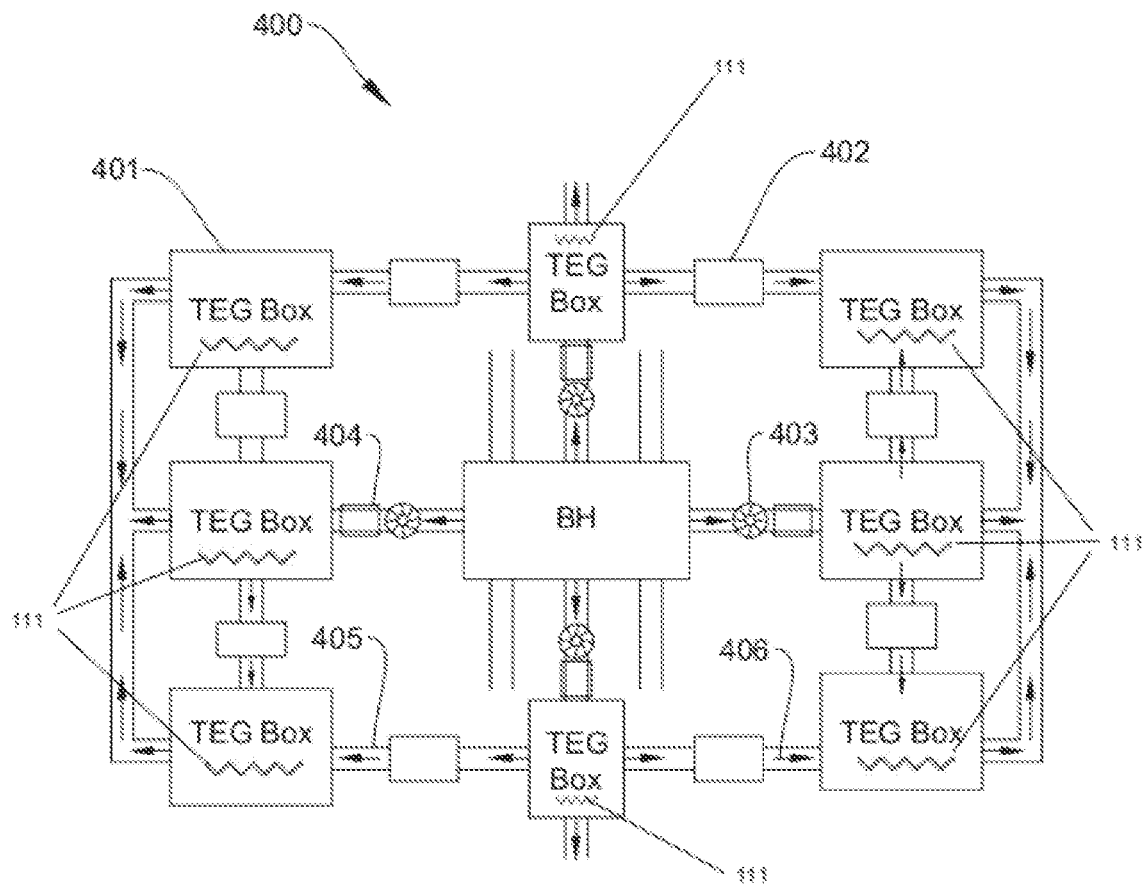
FIG. 1 shows a network of plasma boxes connected together via heaters and fans. A number of thermoelectric generator (TEG) boxes are connected in series to extract power from flue gasses. This design provides efficiency of scale. The components of FIG. 1 include TEG box (401), heater (404), fan (403), flow of gasses (405 and 406).

The invention is a device and system for energy generation having the following components:
(a) plasma production in a first combustion chamber (also called a first plasma chamber) using magnetic concentration of oxygen molecules and heat input
(b) incineration of a solid fuel in the first plasma chamber to create heat
(c) using said heat to produce electricity via an array of thermoelectric generators
(d) ducting water-vapor-rich flue gasses from the first combustion chamber into a second combustion chamber (also called a second plasma chamber) to create a second plasma from the flue gasses
(e) using the plasma to generate hydrogen gas and carbon dioxide gas from flue gas plasma
(f) using a membrane to separate the hydrogen case from the flue gas mixture
(g) using the hydrogen as a fuel to drive a turbine generator to generate electricity.

In the invention, a magnetic field is used to ionize the oxygen molecules, and to concentrate and channel the ionized oxygen from the atmosphere into the first combustion chamber, wherein the oxygen ions, which are negatively charged are contained and mixed with solid waste fuel which has become positively charged through heating to about 120 degrees Centigrade, producing a self-sustaining exothermic reaction.

The present invention also provides complete combustion not leaving any extra Oxygen molecules available to form any toxic substances such as difurans, dioxins, SOX, NOX.

The invention comprises several stages:
1) The fuel input stage where fuel is introduced into a first combustion chamber
2) The combustion stage using plasma
3) The thermoelectric generator stage generating electricity from heat
4) The flue gas plasma heating stage
5) The hydrogen gas generation stage
6) The second electricity generation stage using a hydrogen powered turbine generator
7) The exhaust gas scrubbing and cleaning stage In the fuel input stage, fuel is introduced into a first combustion chamber. The fuel input stage typically uses a conveyor, a hopper and a feeder unit which transport waste on the conveyor, pass it into the hopper, and then into the feeder which then leads into a combustion chamber.

In the combustion stage a plasma is produced in a first combustion chamber (also called a first plasma chamber) using magnetic concentration of oxygen molecules and heat input. Magnets are used to concentrate paramagnetic oxygen which is funneled in to the combustion chamber. The chamber is heated with a heat source such as gas of electrically heated elements, and the concentrated paramagnetic oxygen is heated to produce a plasma and used to combust the fuel.

In the thermoelectric generator stage, electricity from heat using a plurality of thermoelectric generator modules. The thermo-electric-voltage-generator layer may comprise a thermocouple or thermopile. A thermoelectric generator (TEG), also called a Seebeck generator, is a solid-state device that converts temperature differences directly into electrical energy through a phenomenon called the Seebeck effect (a form of thermoelectric effect). Thermoelectric generators function like heat engines, but are less bulky and have no moving parts. However, TEGs are typically more expensive and less efficient. The thermoelectric generator may be incorporated into the combustion chamber as a layer in the wall of a plasma chamber, adapted to produce electricity from heat or from a heat differential, such as a thermocouple or other means or device that produces a temperature-dependent voltage as a result of the thermoelectric effect. See Adroja et al., "Review of thermoelectricity to improve energy quality" 2; Issue 3 Mar. 2015 JETIR.

The flue gas plasma heating stage uses heat input to heat the flue gasses. Heat may be produced using a heat source such as gas of electrically heated elements, and/or by using magnetically concentrated oxygen to produce a plasma where concentrated paramagnetic oxygen is heated to produce a plasma and used to combust the fuel.

In the hydrogen gas generation stage, the flue gas is heated to become a plasma and hydrogen gas is dissociated from water.

In the second electricity generation stage, the separated hydrogen gas is used to power a turbine generator.

In the exhaust gas scrubbing and cleaning stage, exhaust gasses are iteratively rotated through one or more scrubbers and filters to remove remailing harmful components before being vented to the atmosphere.

The combustion chamber used in the invention is referred to by the inventor as "Black hole".

FIG. 1 shows a network of plasma boxes connected together via heaters and fans a number of thermoelectric generator (TEG) boxes are connected in series to extract power from flue gasses. This design provides efficiency of scale. The components of FIG. 1 include TEG box (401), heater (404), fan (403), flow of gasses (405 and 406).

Figure 2:
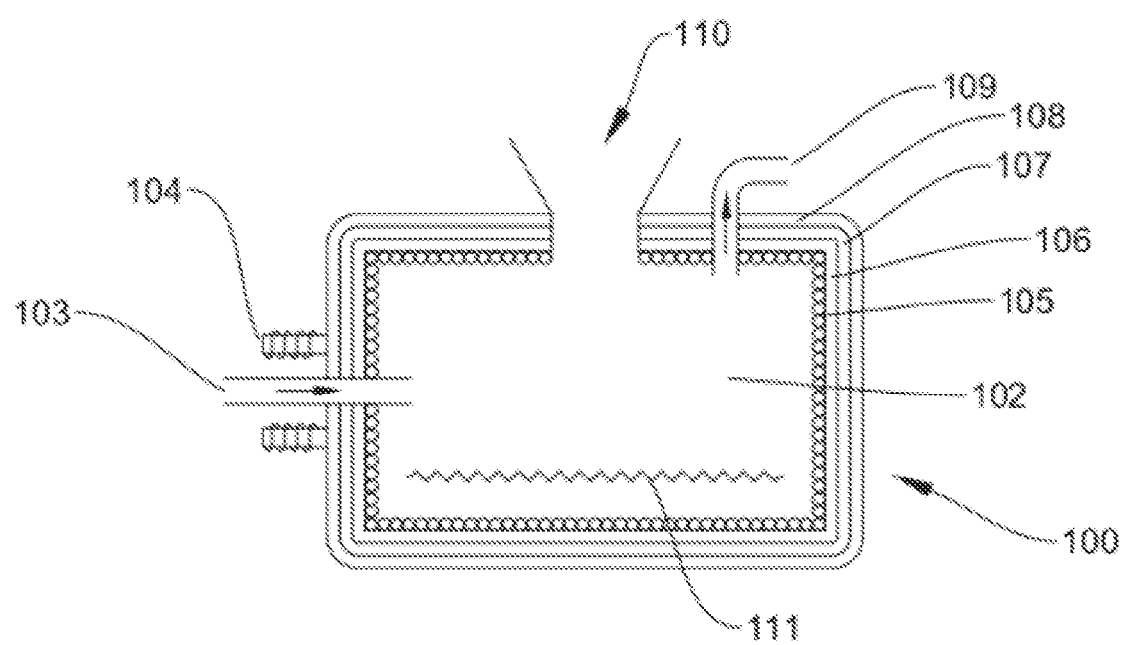
FIG. 2 shows a plasma chamber (100) defining a void (102), gas inlet (103), magnetic field generator (104), brass coil layer (105), thermo-electric generator layer (106), coolant layer (107), insulation layer (108), gas flue outlet (109), optional fuel inlet port (110), and electron donation element (111).

FIG. 2 shows an embodiment wherein the TEG elements are incorporated into the plasma box, where the TEG elements at least partially enclose a void at the center of the combustion chamber. The elements include a plasma chamber (100) defining a void (102), gas inlet (103), magnetic field generator (104), brass coil layer (105), thermo-electric generator layer (106), coolant layer (107), insulation layer (108), gas flue outlet (109), optional fuel inlet port (110), and electron donation element (111).

Figure 3:
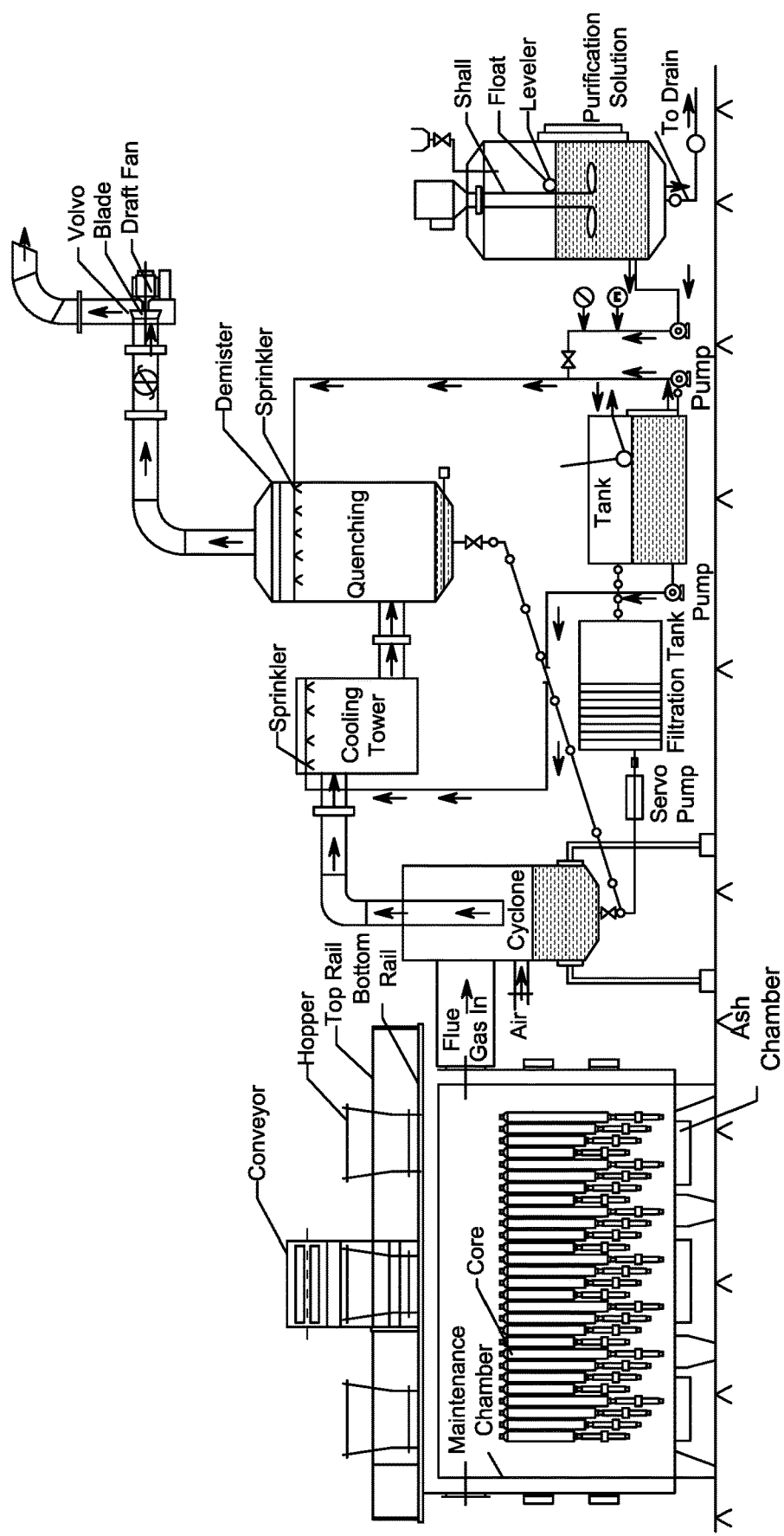
FIG. 3 shows an embodiment of the entire system including all the elements: conveyer, feeder, "black hole' core parts comprising an array of thermoelectric generators in a first combustion chamber where a plasma is created, ducts for ducting flue gasses into quenching water-vapor-rich flue gasses from the first combustion chamber into a second combustion chamber where a second plasma from the flue gasses.

FIG. 3 shows an embodiment of the entire system including all the elements: conveyer, feeder, "black hole' core parts comprising an array of thermoelectric generators in a first combustion chamber where a plasma is created, ducts for ducting flue gasses into quenching water-vapor-rich flue gasses from the first combustion chamber into a second combustion chamber where a second plasma from the flue gasses.

Figure 4:
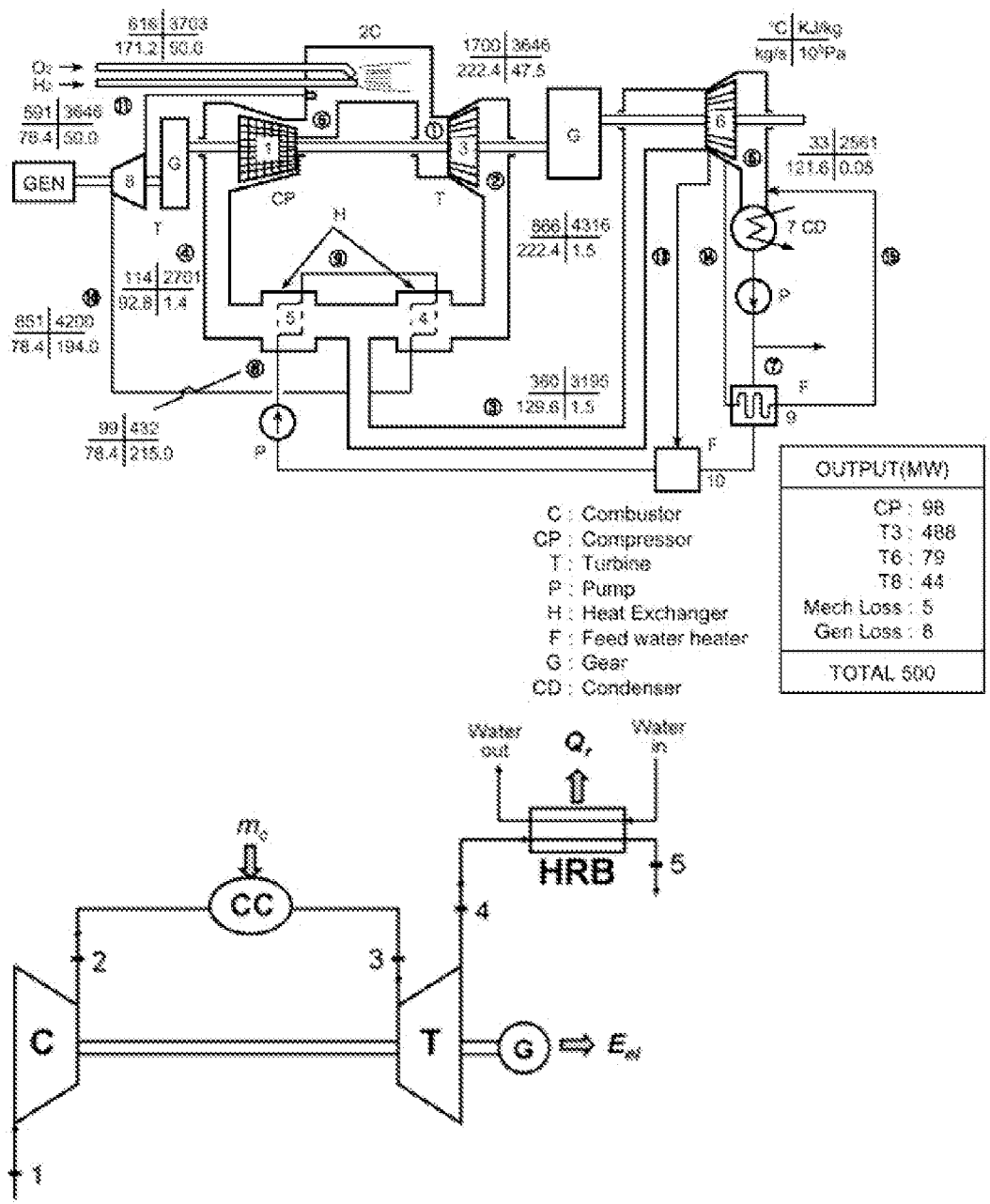
FIG. 4 shows a schematic of a gas turbine designed to run on Hydrogen.

FIG. 4 shows a schematic of a gas turbine designed to run on Hydrogen.

FURTHER EMBODIMENTS AND DISCLOSURES OF THE INVENTION

The applicant further supplies the following description and details of various embodiments of the invention. The invention is not limited by the following embodiments.

The system of the invention uses controlled plasma ignition and incineration to incinerate waste and produce energy. The system may be referred to as a low plasmic thermal vibration process. In a preferred embodiment energy is produced by the generation of Hydrogen gas which is burned in a gas turbine to produce electricity. The present invention provides true complete combustion not leaving any extra Oxygen molecules available to form any toxic substances such as difurans, dioxins, SOX, NOX. The invention uses a magnetic field to ionize atmospheric oxygen molecules, and to concentrate and channel the ionized oxygen from the atmosphere into a combustion chamber. The oxygen ions, which are negatively charged are contained and mixed with solid waste fuel which has become positively charged through heating to about 150-250 degrees Centigrade, producing a self-sustaining exothermic reaction. Hydrogen gas is produced in large amounts by this process. The combustion unit may consist of different inlets and outlets and components including a power up inlet, a feeder unit inlet, a plasmic box, an ash box, and flue gas outlet. The system may be generally cuboid in shape and has multiple inlets for gases, for example for ionized oxygen. These inlets may have there-attached one or more magnets or electromagnets to magnetize oxygen molecules. The inlets may be placed concentrically about the base and evenly distributed about the plasmic box. The gas inlet tubes are fixed to the lower portion of the plasmic box. The atmospheric gases are passed through the tubes at normal temperature and pressure without using additional energy.

The feeder is funnel-shaped and the waste is dumped to the feeder through the logic-circuit controlled conveyor system. The feeder consists of three-layered door, which doors are operated by the programmable logic control units. The feeder doors do not open and close simultaneously. The top feeder door is programmed to receive the municipal waste from the conveyor system. The middle feeder door is designed to store the municipal waste. The third feeder door is further designed to deliver the waste into the plasmic box for incineration.

The power-up inlet consists of a door and a fuel tank with burner for starting the plasmic box. The inner surface of the plasmic box consists of oval shaped copper coils insulated with stainless steel tubes. The base of the plasmic box consists of fins made up of copper coils insulated with stainless steel tubes as well.

The flue gas outlet from the plasmic box is connected to a cleaning apparatus such as a wet scrubber. The flue gasses are scrubbed and vented to the atmosphere through an exhaust. The flue gas is subjected to different stages of scrubbing in the scrubber system.

Any element can attain plasma state when subjected to high temperature or a magnetic field such as that generated by electro-magnets or NdFeB magnets or similar. Electrically conductive plasma produced thereby is an electrically neutral medium of unbound positive and negative particles (i.e. the overall charge of a plasma is roughly zero). Although these particles are unbound, they are not 'free' in the sense of not experiencing electric or magnetic forces. Moving charged particles through a magnetic field will generate an electric current within the field. Any movement of a charged plasma particle affects and is affected by the fields created by the other charges. The term "plasma density" by itself usually refers to the "electron density", that is, the number of free electrons per unit volume. Ionized Oxygen has a negative charge because it has 6 electrons in the outer shell, and an atom always "wants" 8 electrons in the outer shell to achieve stability, therefore in its atomic form Oxygen has a charge of $-2$. $O_2$ is a non-polar molecule. But oxygen can be made to produce an induced dipole when subjected to electric or magnetic fields. Oxygen is therefore attracted to magnets (e.g. NdFeB) in both gaseous and liquid form.

With the help of this magnetic field, the inlet tubes are able to harness the attractive properties of atmospheric gas mainly oxygen and are able to concentrate the oxygen gas and to a greater or lesser extent to exclude other atmospheric gases, i.e., Nitrogen. By adjusting the magnetic fields of the inlet tubes, the system of the invention can be programmed to control the precise quantity of oxygen atoms entering the plasmic box, and this can be adjusted based upon the type of waste entering the plasmic box.

At the initial stage of the process, dry waste is inserted up to ⅓rd of the volume of the plasmic box. This dry waste is flamed with the help of a power up burner or a hand propane torch. Slowly, the inside temperature starts rising and reaches up to 120 degree Celsius. At this point the molecules from the dry waste start dissociating releasing negatively charged electrons from their outer orbits. This gives an overall positive charge to the waste. At this point, there are free electrons in the plasmic box and positively charged waste. The inlet tubes are now opened to allow the controlled/programmed inflow of Oxygen atoms (O) into the plasmic box which now contains, waste, free electrons, and Oxygen atoms. This is a highly unstable arrangement so the first electron enters the Oxygen atom and forms $O^{-1}$. This reaction is an endothermic reaction, which is accomplished with the available heat from the initial burning of the waste. $O^{-1}$ is still unstable, so a second electron combines with $O^{-1}$ to form $O^{-2}$. This is also an exothermic reaction.

The addition of two electrons from the heated fuel (waste) to the Oxygen atoms, and their combination, results in a net heat gain. this net heat gain is used to form the following O2 molecules with always a positive heat balance. this results into the formation of hot ionized oxygen (plasma).

The degree of ionization depends upon the type of waste entering the plasmic box, which then dictates the number of electrons released into the plasmic box from dissociation of waste molecules. Ultimately, the number of electrons in the plasmic box decides the number of Oxygen atoms being delivered into the plasmic box to form O-2 molecules, which ultimately dictates the temperature inside the plasmic box.

The higher the number of electrons released from the waste, the higher the number of Oxygen atoms entering into the plasmic box, therefore the higher number of exothermic reactions to form $O^{-2}$, creating higher temperatures, creating a plasma state.

Since the available Oxygen molecules are negatively charged and the waste molecules are positively charged and their density is directly proportional to each other, therefore it results in true complete combustion. This perfect balance between the available Oxygen molecules, the waste and the exothermic reaction to form $O^{-2}$ molecules creates a perpetual heat source with minimal emissions.

Since the flow of Oxygen into the plasmic box is entirely dependent upon the type of waste entering the plasmic box, a true complete combustion is achieved not leaving any extra Oxygen molecules available to form any other molecules like Difurans, dioxins, SOX, NOX resulting in a flue gas containing only trace amounts of these elements compared to any other waste incineration systems.

Moisture content in the waste doesn't cause much of negative impact on the efficiency of the system. $H_2O$ in the moisture dissociates into one Hydrogen atom and two oxygen atoms and forms ionized hydrogen and ionized oxygen enhancing the efficiency of the already existing plasma state in the plasmic box. Ionization of hydrogen gives rise to high heat plasma and ionization of oxygen leads to low heat plasma.

The system of the invention is capable of producing energy using Municipal Solid Waste. Once the "fuel" enters it first produces a flue gas and, later, after a series of purges and super depuration, separates the hydrogen (H) from carbon dioxide ($CO_2$). The hydrogen at this point sent to the gas turbine specifically designed for this fuel and is converted into energy. Energy production with municipal solid waste (MSW) is estimated as described.

Example of Production Plant

An example of a plant of the invention may incinerate approximately 1,000 tons of waste per day.

Production of Hydrogen may achieve the following characteristics:
Hourly production Hydrogen: 5902 Kg/h
Hourly production: 67,873 Nm3 hydrogen
P.C.I. Hydrogen: 143 Mj/kg
Thermal Power: 234,440 KW/h Taking into consideration a gas turbine combined cycle type GE LM 6000-PF with hourly capacity of output of 50 MWe of electrical power and 250 Mwt thermal power, taking into account an hourly consumption of 12-15,000 m3/h of gas (data calculated with flue gas Kj/m3 34,500=8, 240 Kcal/h) it can be possible to produce as described below: 67 873 m3 (total production time)=5 gas turbine 50 Mwe=250/Mweh 13,000 m3 (m3/h each gas turbine) It goes without saying that, given that P.C.I. hydrogen, (10,760 kJ/m3) and higher than that of the flue gas taken into consideration for the calculation of the turbine GE LM-6000 PF you can safely assume a higher yield considering exact production data Kg/h of hydrogen. The production of hydrogen in fact varies according to the type of waste fed into the process. In order to realize an optimum product supply to the Blackhole, efficient from the point of view of thermal efficiency to be subjected to plasma treatment, mixing the pollutants that are tied within the vitrified slag, it will be necessary to identify the percentages of products to be inserted into the Blackhole. The massive quantity in m³ of hydrogen produced can be utilized for electricity generation.

This example of an oversized initial plant will have a higher initial cost, but will provide a huge saving. Efficiency of the system can be calculated on the basis of the Rankine cycle model; see Canada et al., 2004 Oct. 25 "Parabolic Trough Organic Rankine Cycle Solar Power Plant" (PDF). 2004 DOE Solar Energy Technologies. Denver Colorado US Department of Energy NREL.

Process Summary

The process described below shows the basic scheme of the system BPTS (Blackhole plasma treatment system) proposed, and tries to explain how municipalities can eliminate all pollutants in the area and, through the production of flue gas/Hydrogen, generate Clean Green Renewable Electricity Energy; and obtained as a by-product liquid $CO_2$.

The Plasma State

The plasma state uses air (compressed and ionized) as the main component. Not surprisingly, one of the first applications of the plasma state was precisely, to eliminate the massive amount of chemical and biological gas for use in war. The high production of flue gas obtained, approximately 1.3-1.6 Kg per Kg of pollutant input (indicative value varying with the type of mixed waste complete and its water content) means that roughly every 1,000 metric tons of waste enters into the plant, the plant produce, roughly 1,500,000 M³ of flue gas. This huge amount of gas requires subsequent depuration treatment.

Operating Process

Once collected and stored the various materials are mixed and verified before entering into the plasma reactor. The granular waste to be introduced in the reactor comes into contact with the high temperature plasma (about 5,000° C.). The inorganic free of carbon (with the exception of carbides and carbonates that follow the process of plasma structure transformation) immediately binds to the small amount of Dioxins and Furans and other persistent organic pollutants (POPS) and becomes vitrified and is precipitated. It falls to the bottom of the Blackhole device and is disposed of and may be used with other non-hydroscopic inert materials for foundations in construction.

The production of dioxins and furans occurs mainly with combustion of oxygen, which is not the case of the BPTS system. The production of POPS is very low or nil in this system. Any dioxins and furans would bind in a stable manner into vitrified slag making them not a subject to the leaching process. The glassy material produced by the plant meets Italian and European regulations for its use as a building material such as general foundations for roads and buildings.

The second part of the process is concerned with the purification of the flue gas by passing it through a series of equipment stages for the washing and elimination of particulate pollutants. Washing elements may include Quencher collisional, Scrubber and Venturi Scrubber devices.

The process produces a flue gas mainly composed of Hydrogen (H2) and carbon dioxide ($CO_2$). These gasses are separated using specific membranes, and the carbon dioxide and hydrogen are separated and hydrogen gas is used to power a generator.

The carbon dioxide will follow a path of further purification, cleaning, compression and subsequent liquefaction through cooling and compression. The storage of this product obtained will take place in suitable combined tanks ready for further transport and use. The production of liquid $CO_2$ in fact eliminates the emission into the atmosphere guaranteeing overall benefit for the planet and fully respecting the Kyoto agreement.

Additionally, the applicant discloses that the remaining flue gas is cleaned of pollutants. up to obtaining a compound of hydrogen (H) and carbon monoxide (CO). The flue gas obtained at this point passes through a separation filter to micro membrane that separates the H from the CO. The CO is at this point treated through a system of towers catalyst and "forced" to be completed in its becoming so "carbon biossiso". The additional molecule of oxygen is supplied to the CO through the separation of the water introduced forcibly catalyst spray towers which, being at a temperature between 300 and 600° C., allows the evaporation of water with the consequent disintegration the same molecule (H2O).

The hydrogen produced will be fed directly to the inlet nozzles of the gas turbine for the production of electricity. The properties of the hydrogen gas differ from the properties of natural gas, in fact the natural gasses have different combustion characteristics. The combustion of the hydrogen also produces significantly lower emissions of NO and CO. The low CO emissions during the operation with hydrogen indicate a stable regime of combustion, while the low emissions of NO demonstrate the positive effect of the steam content of the flame temperature. Consequently, the total emissions of nitrogen oxides during the combustion of the hydrogen are very low.

The hydrogen is burned in a turbine generator. In one embodiment the GE.LM 600-PF. The gas turbine systems (Joule-Brayton cycle) is used in this system, and it is now widely used because of its compactness and forms the basis of co-generation plants and combined cycle plants. The basic scheme of a gas turbine plant is shown in the figures.

The invention claimed is:

1. A system for the generation of electricity by the incineration of solid waste having a significant moisture content, the system comprising: (a) a fuel input for delivering solid fuel into a first plasma chamber, (b) a first plasma chamber designed to contain a plasma and combust fuel therein, (c) a first heating means within the combustion chamber, (d) a thermoelectric generator contained within the combustion chamber for generating electricity from heat, (d) a second plasma chamber containing a second heating means, (e) a vent attached to the second plasma chamber in communication with a separating membrane adapted to separate hydrogen from as mixture of hydrogen and carbon dioxide, (f) a collection chamber for collecting hydrogen gas, and (g) a generator attached to the collection chamber adapted to generate electricity from the combustion of hydrogen.

2. The system of claim 1 further comprising, within the second plasma chamber, a second thermoelectric generator.

3. The system of claim 1 further comprising gas input vents in communication with both atmospheric air at one end and with the first plasma chamber at the other end, and having disposed about the exterior surface of the vent a plurality of magnets adapted to induce a dipole in oxygen molecules.

4. The system of claim 1 wherein the first plasma chamber is composed of a substantially closed container having an outer surface and an inner surface, defined by walls, and enclosing an interior space, the interior space enclosing at least one electron-donation element, further comprising one or more gas inlets traversing the walls and adapted to introduce gas from outside the plasma chamber into the interior space of the plasma chamber, further comprising one or more magnetic field generators positioned in proximity to one or more of the gas inlets, further comprising a flue gas outlet.

5. The system of claim 4 wherein the electron-donation element comprises titanium and/or platinum.

6. The system of claim 4 wherein the walls have layers, comprising, from the inside towards the outside, a heat-conducting layer, a thermo-electric-voltage-generator layer, a coolant-conducting layer, and an insulating later.

7. The system of claim 4 wherein the heat conducting layer consists of metal coils.

8. The system of claim 4 wherein the metal coils are brass and are at least partially coated with zirconia.

9. The system of claim 4 wherein the thermo-electric-voltage-generator layer comprises a thermocouple.

10. The system of claim 4 wherein the coolant-conducting layer comprises conducting members adapted to conduct a coolant fluid.

* * * * *